United States Patent [19]

Legge et al.

[11] Patent Number: 5,023,503
[45] Date of Patent: Jun. 11, 1991

[54] SUPER HIGH FREQUENCY OSCILLATOR/RESONATOR

[75] Inventors: Ronald Legge, Scottsdale; Curtis D. Moyer, Phoenix, both of Ariz.

[73] Assignee: Motorola, Inc., Schaumburg, Ill.

[21] Appl. No.: 460,454

[22] Filed: Jan. 3, 1990

[51] Int. Cl.$^5$ .......................... H01L 41/08
[52] U.S. Cl. .................. 310/311; 310/348; 310/321; 333/188; 333/200
[58] Field of Search ................ 310/31, 321, 322, 323, 310/328, 330, 348, 349; 333/187, 188, 192, 197, 200

[56] References Cited

U.S. PATENT DOCUMENTS

| | | | |
|---|---|---|---|
| 4,191,905 | 3/1980 | Yasuda | 310/348 |
| 4,282,454 | 8/1981 | Wakat et al. | 310/348 |
| 4,282,498 | 8/1981 | Iizawa | 333/200 |
| 4,633,124 | 12/1986 | Kawashima | 310/348 |
| 4,906,840 | 3/1990 | Zdeblick | 310/328 |

FOREIGN PATENT DOCUMENTS

| | | | |
|---|---|---|---|
| 0056785 | 5/1979 | Japan | 310/348 |
| 2002955 | 2/1979 | United Kingdom | 310/348 |

Primary Examiner—Mark O. Budd
Attorney, Agent, or Firm—Joseph P. Krause

[57] ABSTRACT

A method of filtering an AC signal using a piezoelectric beam is provided. A piezoelectric film is formed on a mechanical support and a portion of the piezoelectric film forms a beam which extends beyond the mechanical support so that a cavity is formed underneath the beam, and the beam is free to vibrate in the cavity at a resonant frequency when an acoustic wave is propagated in the piezoelectric layer.

A depletion region is formed under a Schottky contact which serves as a drive electrode. An unfiltered AC signal is coupled to the drive electrode thereby establishing an acoustic wave when the unfiltered AC signal comprises a component at the resonant frequency. Surface charge on the piezoelectric film resulting from vibration of the beam allows the resonant frequency component of the unfiltered AC signal to pass through the depletion region. Alternatively, the resonant frequency component can be passed by a tunnel current through the cavity.

19 Claims, 4 Drawing Sheets

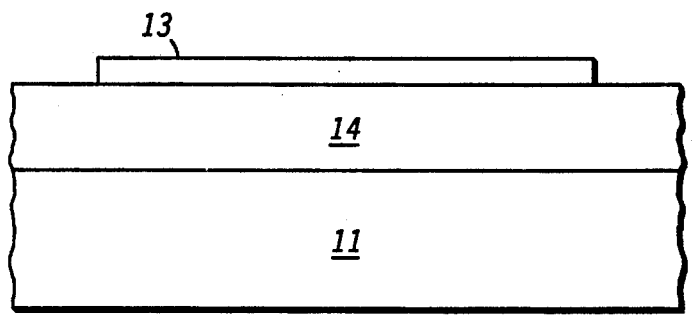
FIG. 1
FIG. 2
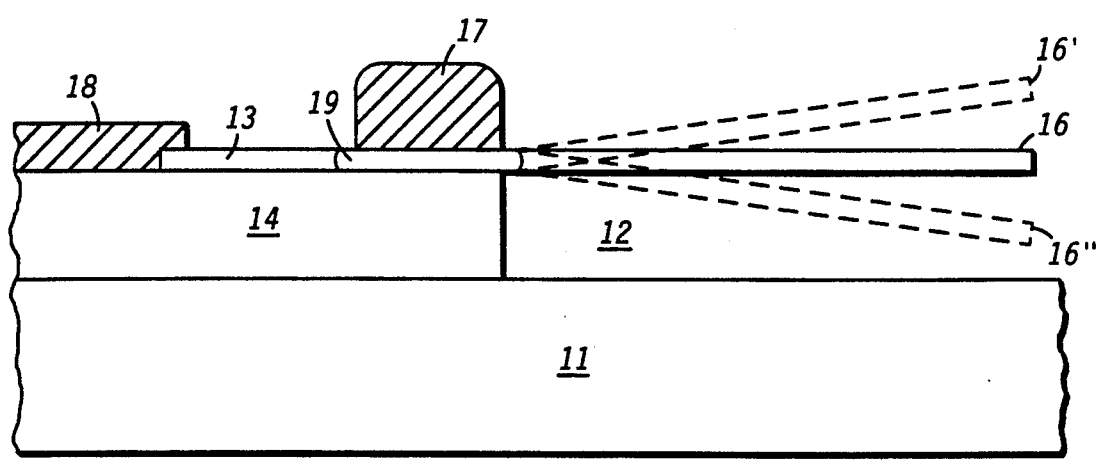

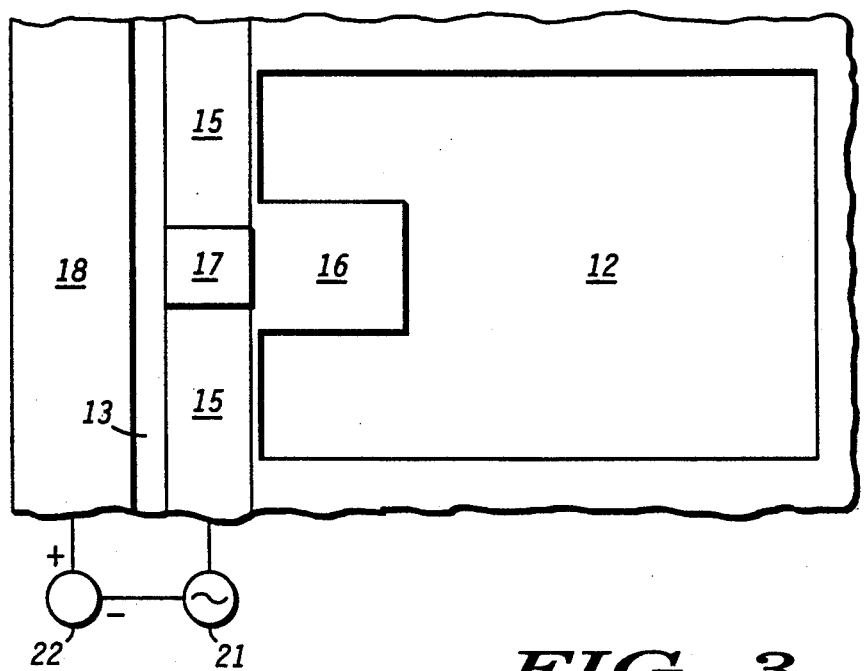
FIG. 3
FIG. 4
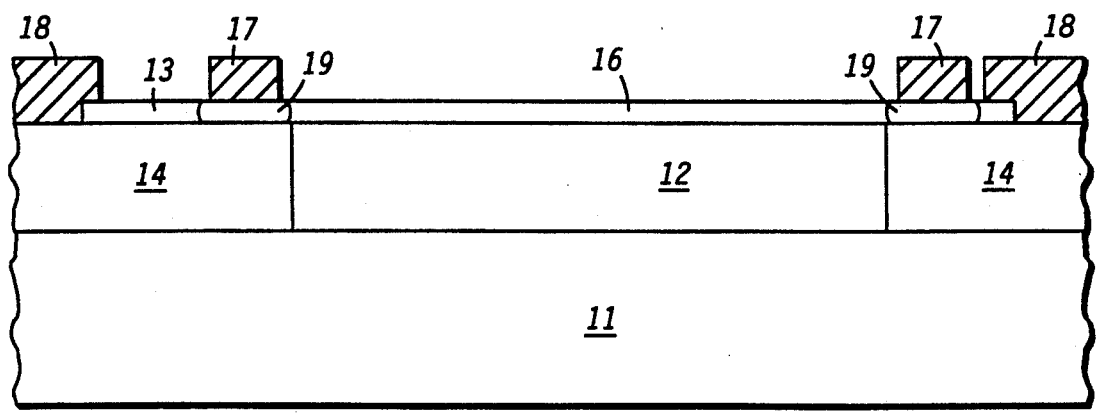

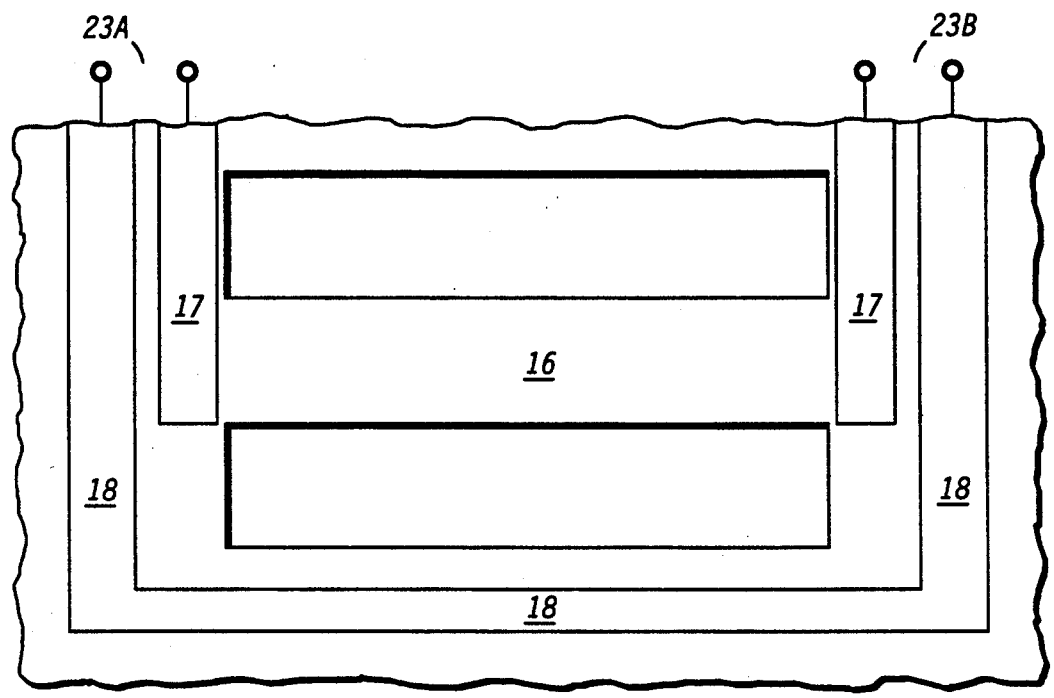
FIG. 5
FIG. 6
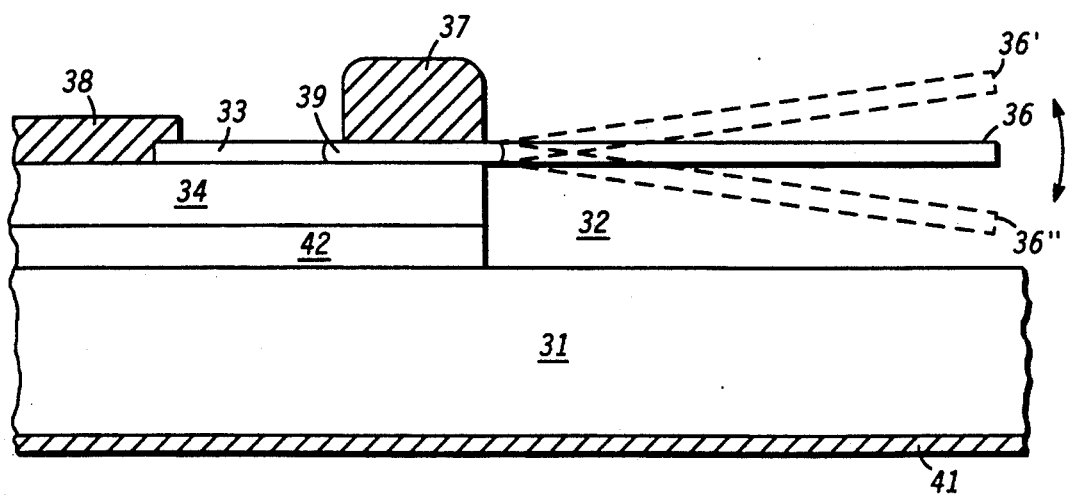

SUPER HIGH FREQUENCY OSCILLATOR/RESONATOR

BACKGROUND OF THE INVENTION

This invention relates, in general, to resonators and oscillators, and more particularly to piezoelectric resonators and oscillators which can be integrated with other electronic devices.

In the design of radio receivers, particularly paging receivers, cellular radios, and microwave satellite communication systems, it is desirable for components which form the system to take up as little space as possible. It is desirable for as many components as possible to be integrated into a single integrated circuit. This integration also reduces connections needed to make the radio, greatly improving reliability and reducing manufacturing cost.

Besides reduced size, higher and higher operating frequencies have become more common. This has led to the use of semiconductor materials which can operate in the gigahertz (GHz) frequency range to be used for the electronic components. Integrated circuits manufactured in gallium arsenide can operate at these frequencies. One problem that is basic to the operation of a high frequency radio, however, is generation of a high frequency oscillating electric signal which is used to both transmit and receive information. Similarly, resonator circuits which can be used as high frequency filters in the gigahertz frequency range are needed.

It has been known for some time that certain crystalline materials have piezoelectric properties. Specifically, there is what is called a direct piezoelectric effect, in which electrical charges appear on crystal surfaces upon the application of an external stress. There is also a converse piezoelectric effect, in which the crystal shows strain or deformation when an electrical charge is applied by external means to faces of the crystal. These effects have been used for many years in crystal oscillators and other devices in which bulk acoustic waves are transmitted through a crystal, typically between electrode plates at opposite faces of the crystal.

Usually, quartz crystals are used to make high frequency oscillators and resonators. These quartz oscillators are called bulk acoustic wave devices because acoustic waves are propagated throughout the bulk of the crystal. However, quartz crystal oscillators cannot be integrated with other components, and so must be coupled to other components on PC boards or hybrid substrates. Also, the technology of quartz crystal oscillators limits their ability at higher frequencies. Use of bulk waves in this manner has provided crystal oscillators and filters with good temperature stability, but with frequencies limited to about 200 megahertz (MHz) due to excessive capacitance, and more typically falling below 50 MHz. Consequently, higher frequencies cannot be obtained without the expense of more components, such as frequency multipliers. Also, when high frequencies are derived from multipliers, accuracy and stability are sacrificed. Because cost, accuracy, and size of frequency multiplier circuitry is proportional to multiplication necessary, it is advantageous to use as little frequency multiplication as possible.

Besides bulk acoustic wave devices, other piezoelectric devices, also called electroacoustic devices, fall into two basic categories: surface acoustic wave (SAW) and shallow bulk acoustic wave (SBAW). As their names imply, each of the variations refers to the location of the acoustic wave with respect to a piezoelectric film: at the surface or just below the surface. Devices using SBAW have become increasingly popular because they are more stable than SAW devices and can operate at higher frequencies.

Acoustic waves are generated in a piezoelectric film by providing an electric field across the film. Since most piezoelectric films are insulators, it is easy to establish an electric field across the film. Vertical waves can be established by an electric field across opposed surfaces of a piezoelectric film, while lateral waves can be established by two electrodes on a single surface. If an oscillating or pulsing electric field is supplied across the film, an oscillating acoustic wave will be established. To make an acoustic wave oscillator/resonator, a standing acoustic wave must be established in the film. Frequency of the standing acoustic wave will be a function of device geometry and physical properties of the piezoelectric material.

Techniques are also known to micromachine silicon structures to form diaphragms, beams, and cantilever beams which can then oscillate when an acoustic wave is established in them. Since silicon is not a piezoelectric material electroacoustic devices could only be made by forming a piezoelectric layer on top of a micromachined silicon structure. These micromachine structures allow higher frequency operation because of the smaller geometries used, as the structures can be formed using conventional semiconductor processing techniques. However, since a piezoelectric film was deposited on top of a non-piezoelectric semiconductor structure, even when micromachining was used the piezoelectric film was supported by an otherwise quiescent structure. Mechanical coupling between the piezoelectriC film and a non-piezoelectric material results in damping of the acoustic wave and lowered quality factor (Q) of acoustic wave filters and oscillators. Until now, devices which use an unsupported piezoelectric layer have not been available.

Accordingly, it is an object of the present invention to provide a method for generating an oscillating current of very high frequency.

It is a further object of the present invention to provide a piezoelectric resonator which can be monolithically integrated with other semiconductor devices.

A further object of the present invention is to provide a resonator with improved reliability.

Another object of the present invention is to provide a piezoelectric resonator wherein the piezoelectric element is not supported by a non-piezoelectric material.

Another object of the present invention is to provide an electroacoustic resonator/oscillator using a piezoelectric semiconductor material.

A further object of the present invention is to provide an electroacoustic resonator which uses a Schottky gate to establish an acoustic wave.

SUMMARY OF THE INVENTION

These and other objects and advantages of the present invention are provided by a method of filtering an oscillating electric signal wherein a piezoelectric film is formed on a mechanical support and a portion of the piezoelectric film forms a beam which extends beyond the mechanical support so that a cavity is formed underneath the beam, and the beam is free to vibrate in the cavity at a resonant frequency when an acoustic wave is propagated in the piezoelectric layer.

At least one drive electrode is coupled to the piezoelectric film, and preferably forms a Schottky contact with the piezoelectric film. A depletion region is formed under the drive electrode by the Schottky contact. An unfiltered AC signal is coupled to the drive electrode thereby establishing an acoustic wave when the unfiltered AC signal comprises a component at the resonant frequency. Surface charge on the piezoelectric film resulting from vibration of the beam allows the resonant frequency component of the unfiltered AC signal to pass through the depletion region, or alternatively switches a semiconductor device. Alternatively, the resonant frequency component can be passed by a tunnel current through the cavity.

BRIEF DESCRIPTION OF THE DRAWINGS

FIG. 1 illustrates an enlarged cross-sectional view of a first embodiment of the present invention comprising a one port resonator at an early stage of processing;

FIG. 2 illustrates the one port resonator of FIG. 1 further along in processing;

FIG. 3 illustrates a top view of the resonator shown in FIG. 2;

FIG. 4 illustrates a cross-sectional view of a second embodiment of the present invention comprising a two port resonator;

FIG. 5 illustrates a top view of the two port resonator shown in FIG. 4;

FIG. 6 illustrates a cross-sectional view of a third embodiment of the present invention comprising a resonator with gain.

DETAILED DESCRIPTION OF THE DRAWINGS

Figure 7:
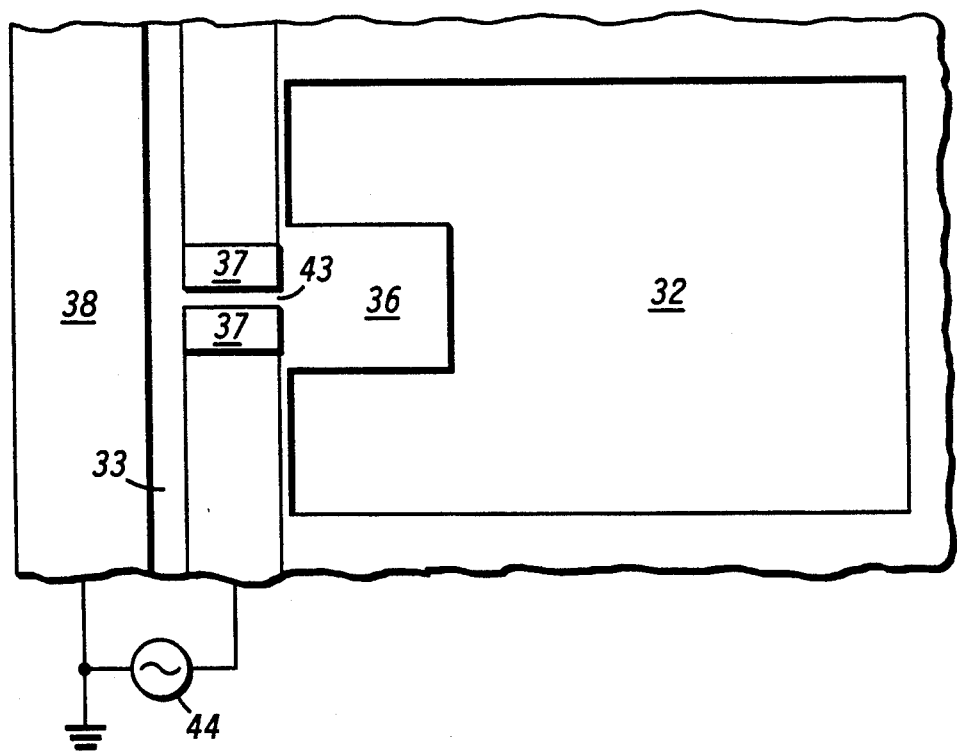
FIG. 7 illustrates a top view of the resonator of FIG. 6.

FIG. 1 illustrates a highly simplified cross sectional view of a first embodiment of a piezoelectric resonator of the present invention at an early stage of processing. It should be understood that many variations of this basic structure are possible and can be easily envisioned which use the method of the present invention. The piezoelectric resonator can be manufactured as a discrete component, or as will be seen, integrated with other electronic devices on an integrated circuit to achieve either a tuned amplifier or an oscillator function. A tuned amplifier is provided by adding a gain structure to the resonator while an oscillator is achieved by adding gain and appropriate feedback to the resonator. A first and second embodiment will be described which are adapted to function as resonators, while a third embodiment illustrates a resonator with a tunneling gain element. The three embodiments differ very little structurally, but illustrate various modes of operation of the present invention.

In the first embodiment, semiconductor layer 11 comprises a semi-insulating or highly resistive layer, and comprises a III-V compound material such as gallium arsenide. Gallium arsenide is useful because other high frequency devices can be manufactured on the same layer and well-known semiconductor processing techniques can be used to manufacture the resonator structure. Semiconductor layer 11 can be formed on another semiconductor or semi-insulating substrate by epitaxial growth techniques.

Semiconductor layer 14 is formed of doped semiconductor material in the first embodiment. Semiconductor layer 14 is formed as a continuous layer covering semiconductor layer 11. Piezoelectric layer 13 is formed covering beam support 14. Piezoelectric layer 13 is patterned and etched using conventional semiconductor techniques. As will be seen, it is necessary that piezoelectric layer 13 is differentially etchable with respect to semiconductor layer 14. This is easily done when semiconductor layer 14 comprises gallium arsenide (GaAs), and piezoelectric layer 13 comprises aluminum gallium arsenide (AlGaAs). Other piezoelectric layers may be used for piezoelectric layer 13 so long as a suitable material is chosen for beam support 14.

FIG. 2 illustrates the structure of FIG. 1 further along in processing. After piezoelectric layer 13 has been patterned and etched, semiconductor layer 14 is selectively etched to undercut piezoelectric layer 13. This etch leaves cavity 12 under beam portion 16 of piezoelectric layer 13. Beam 16 is free to vibrate in cavity 12, as indicated by the deflected beams 16' and 16" shown in phantom.

Electrode 17 forms a Schottky contact to piezoelectric layer 13, and is formed adjacent to beam 16. Electrode 18 forms an ohmic contact to mechanical support 14, and is formed away from beam 16. In the first embodiment a voltage may be applied to electrode 17 by bias supply 22, shown in FIG. 3, so that the Schottky contact is biased during operation. The reverse biased contact results in a semi-insulating region 19, shown in FIG. 1 below electrode 17, and establishes an electric field across piezoelectric layer 13. When a Schottky contact is used, semi-insulating region 19 is merely a depletion region of the Schottky contact when it is reverse biased. With proper design a zero bias depletion depth of the Schottky contact may eliminate any need for bias supply 22. This depletion region allows an oscillating electric field, also called an excitation field, to be established across piezoelectric layer 13. Electrode 18 may contact piezoelectric layer 13 since a depletion region 19 prevents current flow from electrode 18 to electrode 17.

Formerly, piezoelectric semiconductors have not been used as acoustic wave resonators or oscillators because of the difficulty in establishing the excitation field across them, but the use of depletion region of a Schottky diode solves this problem. In addition to a depletion region, other related techniques can be used, such as proton implantation underneath contact 17 which converts semiconducting AlGaAs or GaAs to semi-insulating material. Only by converting a portion of piezoelectric layer 13 to an insulator, or by depleting carriers from that portion, can the excitation field be established.

FIG. 3 illustrates a top view of the resonator shown in FIG. 2. Beam 16 is preferably about 1 micron by 1 micron, and extends out over cavity 12. Electrode 17 is formed near an edge of beam 16 on top of mechanical support 14, which cannot be seen in FIG. 3. Interconnect 15 couples electrode 17 to an external signal 21 and bias voltage 22. As set out hereinbefore bias voltage 22 may be supplied by the zero bias potential of the Schottky contact, and an actual voltage supply may not be necessary. Several electrodes 17 may be formed coupled to piezoelectric layer 13, although only one is shown. In the first embodiment, electrode 17 is coupled to a DC bias 22 which keeps the Schottky contact reverse biased during operation. Electrode 17 is also coupled to an oscillating signal 21 which establishes a vibration in cantilever beam 16. Oscillating signal 21 may be a signal picked up by an antenna coupled to the resonator, for example.

Techniques for forming and placing electrodes 17 to maximize piezoelectric coupling to beam 16 are well-known, as are techniques to form electrodes 17 which excite shallow bulk acoustic waves (SBAWs) instead of surface acoustic waves (SAWs). SBAWs are preferable to SAWs because such devices have longer usable lifetimes and are not significantly effected by contamination or aging of piezoelectric layer 13.

Instead of a cantilever beam, beam 16 can be formed as a fully supported beam as shown in a second embodiment illustrated in FIGS. 4-5. Similar techniques can be used to form a diaphragm in place of beam 16. All reference numbers in FIG. 4 and FIG. 5 are the same as analogous structural elements in FIG. 2 and FIG. 3. As illustrated in FIG. 5, when a full beam is used it is convenient to form electrodes 17 at opposite ends of beam 16, allowing greater flexibility in layout of electrodes 17. One of the electrodes 17 is used to excite a SBAW in beam 16, while the other is used to sense the SBAW and convert its mechanical energy into an electrical signal. DC bias 22, shown in FIG. 3, has been omitted from FIG. 4 and depletion regions 19 are formed by the zero bias potential of the Schottky contacts 17. The unfiltered AC signal 21 (not shown) is applied to one port 23 while the other port 23 is used to detect a filtered output. Although fundamental frequency and harmonic frequencies will be different when different oscillating structures are used, the basic principle of operation will be the same for either a cantilever beam (FIGS. 2-3) or a fully supported beam (FIGS. 4-5). Operation of the present invention is described for the cantilever beam structure only.

The structure shown in FIGS. 2-3 serves as a series resonant structure. Beam 16 has a resonant frequency determined by its geometry. When unfiltered AC signal 21 comprising a component at the resonant frequency is applied across semi-insulating region 19, beam 16 vibrates at the resonant frequency. Unfiltered AC signal 21 may have a low signal to noise ratio and be, for example, a signal from an antenna. Unwanted signals which are of a different frequency than the resonant frequency will have minimal effect on the oscillation of beam 16. The vibration of beam 16, particularly near the edge of mechanical support 14, results in an oscillating surface charge forming on top and bottom surfaces of piezoelectric layer 13, near the supported edge of beam 16. This surface charge oscillates at the resonant frequency and effectively passes the signal at the resonant frequency through depletion region 19 piezoelectrically. Since only components of unfiltered AC signal 21 which are at the resonant frequency can pass through depletion region 19, the AC signal is filtered.

Other semiconductor switches can be used in place of the Schottky contact. For example, a bipolar transistor having the base driven by piezoelectric layer 13, or a field effect transistor having a channel adjacent to or driven by piezoelectric layer 13 could serve to sense the resonant signal from the resonating surface charge. These devices are equally useful in the second embodiment shown in FIGS. 4-5. By using transistors as the sense elements, a resonant gain structure is provided.

A cross-section of a third embodiment shown in FIG. 6 is similar structurally to the embodiment shown in FIG. 2 although the resistivity and material choices for the elements shown are different in the two embodiments. In the third embodiment, layer 31 comprises a conductive material, and is preferably N-type GaAs or AlGaAs. It is advantageous for layer 31 to have a low resistivity so that signal strength is not lost to resistive heating in layer 31. Layer 31 may be formed on a semi-insulating or semiconducting substrate by epitaxial growth, if desired.

Isolation layer 42 is formed to electrically isolate conductive layer 31 from overlying layers. Isolation layer 42 may comprise a semi-insulating material with a wide band gap, or a region of opposite conductivity type from conductive layer 31. As will be seen, isolation region 42 primarily serves to isolate beam 36 from conductive layer 31. Many other suitable locations and techniques can be used to achieve this isolation, such as forming an insulating layer under piezoelectric layer 33.

Mechanical support layer 34, piezoelectric layer 33, and beam 36 are formed by selective etch processes similar to that described in reference to FIG. 2. In this third embodiment, however, beam 36 must have a low resistivity, and an ohmic contact 38 must be made to beam 36. Preferably, ohmic contact 38 is coupled to both piezoelectric layer 33 and mechanical support 34. Like the first embodiment, however, an excitation field must be established across piezoelectric layer 33 to stimulate an acoustic wave. Schottky contact 37 forms a depletion region 39 which allows the excitation field to be established. Schottky contact 37 serves as an excitation electrode and functions similarly to the Schottky contact described in FIGS. 2-3.

FIG. 7 illustrates a top view of the resonator shown in FIG. 6. This structure is essentially the same as that shown in FIG. 3, except for an opening 43 in electrode 17. Both parts of electrode 17 are joined together away from beam 36, although for ease of illustration the point at which they join is not shown. Opening 43 serves to couple beam 36 with electrode 38, so that depletion region 39, shown in FIG. 6, does not prevent current flow between electrode 38 and beam 36.

During operation, a vibration is established in cantilever beam 36 by applying an excitation signal 44 between electrode 37 and electrode 38. Excitation signal 44 is preferably provided by a positive feedback network so that beam 36 oscillates constantly at its resonant frequency. This vibration moves cantilever beam 36 closer to and farther away from semiconductor layer 31. Cavity 32 forms an insulating barrier to current flow between cantilever beam 36 and conductive layer 31. While beam 36 oscillates near conductive layer 31, as indicated by beam 36″, shown in phantom, electrons can tunnel from beam 36 into conductive layer 31. The number of electrons which tunnel through the cavity barrier is a strong function of distance from beam 36 to conductive layer 31. Tunneling can occur through a phenomena known as Fowler-Nordheim tunneling. In order for Fowler-Nordheim tunneling to occur, cavity 32 should be in the order of 5-100 angstroms deep. Tunnel current increases by roughly an order of magnitude for each 0.1 nanometer change in distance between beam 36 and conductive layer 31.

While beam 36 oscillates, an oscillating current will tunnel through cavity 32. Amplitude of the oscillating current which tunnels through cavity 32 will thus be a strong function of the oscillation frequency of beam 36. Current which flows through cavity 32 into conductive layer 31 is then coupled to external circuitry through electrode 41. For ease of description, electrode 41 is illustrated on a bottom surface of conductive layer 31, but it should be understood that more commonly, conductive layer 31 would be contacted from the top surface.

Frequency of oscillation of cantilever beam 36 is determined by the dimensions of cantilever beam 36 including its thickness, width, and length. Since all dimensions can be controlled by semiconductor process techniques such as film deposition, photolithography, and etching which are well-known, dimensions in the order of tens of angstroms up to several micrometers can be accurately and reproducibly achieved.

Although very high frequency oscillations can be achieved because extremely small dimensions can be formed, the third embodiment offers an additional benefit in achieving extremely high frequency oscillation without use of frequency multipliers. Because Fowler-Nordheim tunneling is involved in switching the current, a great deal of nonlinearity is added to the oscillating current signal. This nonlinearity is seen in the time domain as a sharp current pulse which repeats at the resonant frequency. In the frequency domain, however, this sharp pulse can be seen as a current output which is rich in high order harmonics of the resonant frequency. While a resonant frequency of only 1 GHz may be achieved by beam 36, an oscillating signal can be derived from the output which is 9 GHz or more. Techniques for deriving the frequency domain signal are well-known in the art.

By now it should be apparent that all the structures and materials used to create the piezoelectric resonator/oscillator of the present invention are compatible with semiconductor device processing, and particularly to processing of devices on III-V compound semiconductor materials such as gallium arsenide substrates. Each of the resonators described can be made into oscillators by providing appropriate feedback. Amplifiers, filters, and the like can easily be manufactured on an integrated circuit with the piezoelectric oscillator of the present invention, greatly increasing operating frequency of the circuit, and reliability while reducing cost.

We claim:

1. A method of generating an oscillating electric signal comprising the steps of: providing a conductive layer; providing a piezoelectric layer separated from the conductive layer by a cavity of a predetermined depth, wherein the piezoelectric layer is free to vibrate in the cavity; stimulating a shallow bulk acoustic wave in the piezoelectric layer; and detecting the oscillating electric signal from current flowing through the cavity between the piezoelectric layer and the conductive layer.

2. The method of claim 1 wherein the conductive layer comprises a doped semiconductor.

3. The method of claim 1 wherein the predetermined depth is from 5 angstroms to 100 angstroms.

4. The method of claim 1 wherein the piezoelectric layer comprises a cantilever beam which extends over the conductive layer.

5. The method of claim 1 wherein the piezoelectric layer comprises a beam having two ends which are supported, and which extends over the conductive layer.

6. The method of claim 1 wherein the predetermined depth is such that current can flow through the cavity by tunneling through the cavity.

7. A series resonator comprising: a conductive layer; a piezoelectric layer formed on top of the conductive layer which extends beyond the conductive layer to form a beam, wherein the beam is free to vibrate at a resonant frequency; a first electrode formed on the piezoelectric layer for stimulating a vibration in the piezoelectric layer; a semi-insulating region under the first electrode; a second electrode coupled to the conductive layer, whereby piezoelectric charge couples electric signals of the resonant frequency across the semi-insulating region.

8. The resonator of claim 7 wherein the conductive layer comprises doped gallium-arsenide.

9. The resonator of claim 7 wherein the piezoelectric layer forms a cantilever beam.

10. The resonator of claim 7 wherein the piezoelectric layer forms a beam having two ends which are supported.

11. The resonator of claim 7 wherein the cavity is less than 100 angstroms deep.

12. The resonator of claim 9 wherein a frequency of current oscillation is determined by dimensions of the cantilever beam.

13. A piezoelectric resonator comprising: a III-V compound semiconductor substrate; a mechanical support extending upward from a portion of the substrate; a semiconductor layer having a first portion formed on the mechanical support and having a second portion which extends beyond the mechanical support and is free to vibrate; a means for propagating an acoustic wave in the semiconductor layer; and a semiconductor switch formed in the semiconductor layer near an edge of the mechanical support, wherein the semiconductor switch is controlled by surface charge of the semiconductor layer.

14. The resonator of claim 13 wherein the semiconductor switch is formed in the first portion of the semiconductor layer.

15. The resonator of claim 14 wherein the semiconductor switch comprises a Schottky diode.

16. The resonator of claim 14 wherein the semiconductor switch comprises a field effect transistor.

17. The resonator of claim 14 wherein the semiconductor layer consists of a piezoelectric material.

18. The resonator of claim 13 wherein the substrate is conductive and current flows through the semiconductor switch by quantum tunneling from the second portion of the semiconductor layer to the substrate.

19. The resonator of claim 13 wherein the semiconductor switch further comprises a rectifying contact and an ohmic contact to the semiconductor layer.

* * * * *